United States Patent
Maeda

(10) Patent No.: US 12,355,421 B2
(45) Date of Patent: Jul. 8, 2025

(54) ACOUSTIC WAVE DEVICE

(71) Applicant: Murata Manufacturing Co., Ltd., Nagaokakyo (JP)

(72) Inventor: Kenta Maeda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 198 days.

(21) Appl. No.: 18/229,210

(22) Filed: Aug. 2, 2023

(65) Prior Publication Data
US 2024/0072759 A1 Feb. 29, 2024

(30) Foreign Application Priority Data

Aug. 23, 2022 (JP) .................................. 2022-132779

(51) Int. Cl.
*H03H 9/02* (2006.01)
*H03H 9/145* (2006.01)
*H03H 9/64* (2006.01)

(52) U.S. Cl.
CPC .... *H03H 9/02834* (2013.01); *H03H 9/02559* (2013.01); *H03H 9/6483* (2013.01); *H03H 9/145* (2013.01)

(58) Field of Classification Search
CPC ........ H03H 9/6483; H03H 9/725; H03H 9/64; H03H 9/25; H03H 9/02834; H03H 9/72; H03H 9/568; H03H 9/02992; H03H 9/145; H03H 9/205; H03H 9/706; H03H 9/0222; H03H 9/0576; H03H 9/54; H03H 9/605; H03H 9/14588; H03H 9/56; H03H 9/70; H03H 9/02102; H03H 9/02; H03H 9/02559; H03H 9/17; H03H 9/0071; H03H 9/02007; H03H 9/02015; H03H 9/02047; H03H 9/02125; H03H 9/02574; H03H 9/02614; H03H 9/02944; H03H 9/0504; H03H 9/0547; H03H 9/058; H03H 9/1007; H03H 9/1064; H03H 9/13; H03H 9/133; H03H 9/14591; H03H 9/171; H03H 9/542; H03H 9/564; H03H 9/6489; H03H 9/703; H03H 7/0161; H03H 7/19; H03H 9/0009;
(Continued)

(56) References Cited

U.S. PATENT DOCUMENTS

2015/0179919 A1* 6/2015 Kondo ................. H03H 9/1028
310/345
2016/0126927 A1* 5/2016 Lee ..................... H03H 9/02992
29/25.35
(Continued)

FOREIGN PATENT DOCUMENTS

JP 2017-188807 A 10/2017

*Primary Examiner* — John W Poos
(74) *Attorney, Agent, or Firm* — Keating & Bennett, LLP

(57) ABSTRACT

An acoustic wave device includes a first acoustic wave filter including a first piezoelectric substrate and first resonators on the first piezoelectric substrate, and a second acoustic wave filter including a second piezoelectric substrate and second resonators on the second piezoelectric substrate. The first and second resonators are opposed to each other with a gap therebetween. The first and second resonators each include a heat-generation resonator in which a heat generation range has a highest temperature at a time of signal application. The heat generation ranges of the heat-generation resonators do not overlap each other in plan view.

18 Claims, 13 Drawing Sheets

(58) Field of Classification Search
CPC ............ H03H 9/02551; H03H 9/0259; H03H 9/02858; H03H 9/02881; H03H 9/0542; H03H 9/0566; H03H 9/059; H03H 9/1085; H03H 9/1092; H03H 9/1457; H03H 9/6406; H03H 9/6469; H01L 23/00; H01L 2224/16225; H01L 2924/15174; H01L 2924/15192; H01L 2924/15311; H01L 2924/16152
See application file for complete search history.

(56) References Cited

U.S. PATENT DOCUMENTS

| | | | |
|---|---|---|---|
| 2017/0294895 A1 | 10/2017 | Kakita et al. | |
| 2019/0207583 A1* | 7/2019 | Miura | H03H 9/02866 |
| 2021/0376811 A1* | 12/2021 | Koreeda | H03H 9/1085 |

* cited by examiner

ACOUSTIC WAVE DEVICE

CROSS REFERENCE TO RELATED APPLICATIONS

This application claims the benefit of priority to Japanese Patent Application No. 2022-132779 filed on Aug. 23, 2022. The entire contents of this application are hereby incorporated herein by reference.

BACKGROUND OF THE INVENTION

1. Field of the Invention

The present disclosure relates to an acoustic wave device.

2. Description of the Related Art

As communication technology progresses, the importance of a mobile communication network capable of higher-speed and larger-capacity data communication has been increased. Moreover, portable terminals used for the mobile communication network are required to be conformable to many bands at higher frequencies. Acoustic wave filters have characteristics suitable for such portable terminals, and the importance of the acoustic wave filters has also been increased.

For example, Japanese Unexamined Patent Application Publication No. 2017-188807 proposes packaging technology as one aspect of an acoustic wave device, such as an acoustic wave filter. In the packaging technology, IDT electrodes are disposed on two respective piezoelectric substrates to form acoustic wave filters and the two piezoelectric substrates are held such that the IDT electrodes are opposed to each other.

SUMMARY OF THE INVENTION

Preferred embodiments of the present invention provide acoustic wave devices each having excellent reliability.

An acoustic wave device according to a preferred embodiment of the present invention includes a first acoustic wave filter including a first piezoelectric substrate and a plurality of first resonators on the first piezoelectric substrate, and a second acoustic wave filter including a second piezoelectric substrate and a plurality of second resonators on the second piezoelectric substrate. The first piezoelectric substrate and the second piezoelectric substrate are spaced apart from each other such that the plurality of first resonators and the plurality of second resonators are opposed to each other. The plurality of first resonators include a first heat-generation resonator having a highest temperature in the first acoustic wave filter during use. The plurality of second resonators include a second heat-generation resonator having a highest temperature in the second acoustic wave filter during use. A heat generation range of the first heat-generation resonator and a heat generation range of the second heat-generation resonator do not overlap each other in plan view.

According to preferred embodiments of the present invention, acoustic wave devices each having excellent reliability are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
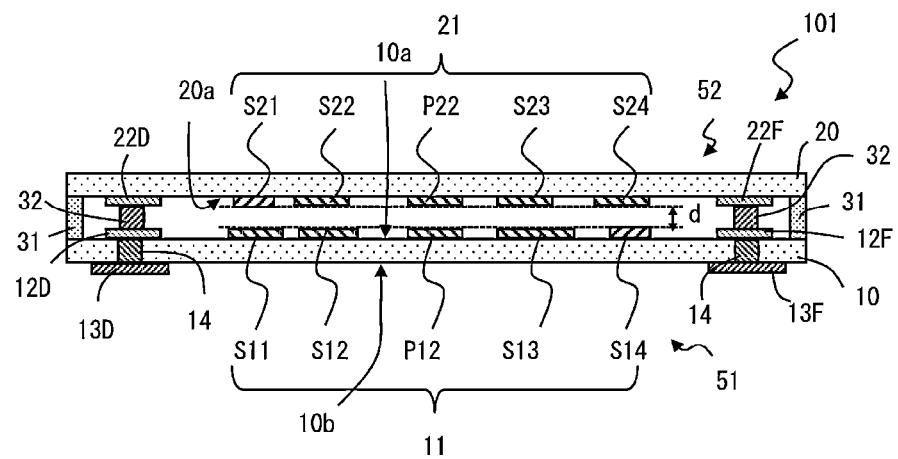
FIG. 1 is a schematic view illustrating an example of a sectional structure of an acoustic wave device according to a first preferred embodiment of the present invention.

Similar to the acoustic wave device disclosed in Japanese Unexamined Patent Application Publication No. 2017-188807, when two acoustic wave filters are accommodated in a package, the two piezoelectric substrates are structured such that IDT electrodes are opposed to each other in order to provide space for excitation of a surface acoustic wave. However, when the inventor of preferred embodiments of the present invention examined such a structure of the acoustic wave device in detail, it was discovered that the effect of heat generated in the acoustic wave filters becomes significant when the two acoustic wave filters are used at the same time. Specifically, it became clear that, as a result of the opposing IDT electrodes affecting each other by the heat generated therein, electrochemical migration of metal of the IDT electrode may be caused, degradation of the IDT electrode may easily occur, and/or electric power handling capability may become insufficient.

In view of the problem described above, the inventor of preferred embodiments of the present invention developed acoustic wave devices each capable of improving reliability and/or electric power handling capability.

Hereinafter, preferred embodiments of the present invention are described with reference to the drawings. The present disclosure is not limited to the preferred embodiments described below, and design of preferred embodiments of the present invention can suitably be changed within a range which satisfies configurations of the present disclosure. Moreover, in the following description, the same reference characters are used in common in different drawings for the same components or components having the same or similar functions, and repetitive description may be omitted. Moreover, the configurations described in the preferred embodiments and modifications may suitably be combined or changed within the scope not departing from the gist of the present invention. In order to make description easier to be understood, in the drawings which are referred to below, the configurations may be illustrated while being simplified or schematized, or components may partially be omitted. Particularly, the number of electrode fingers of an IDT electrode illustrated may be reduced so as to facilitate understanding. Moreover, a dimensional ratio between components illustrated in each drawing does not necessarily indicate an actual dimensional ratio.

First Preferred Embodiment

Figure 2:
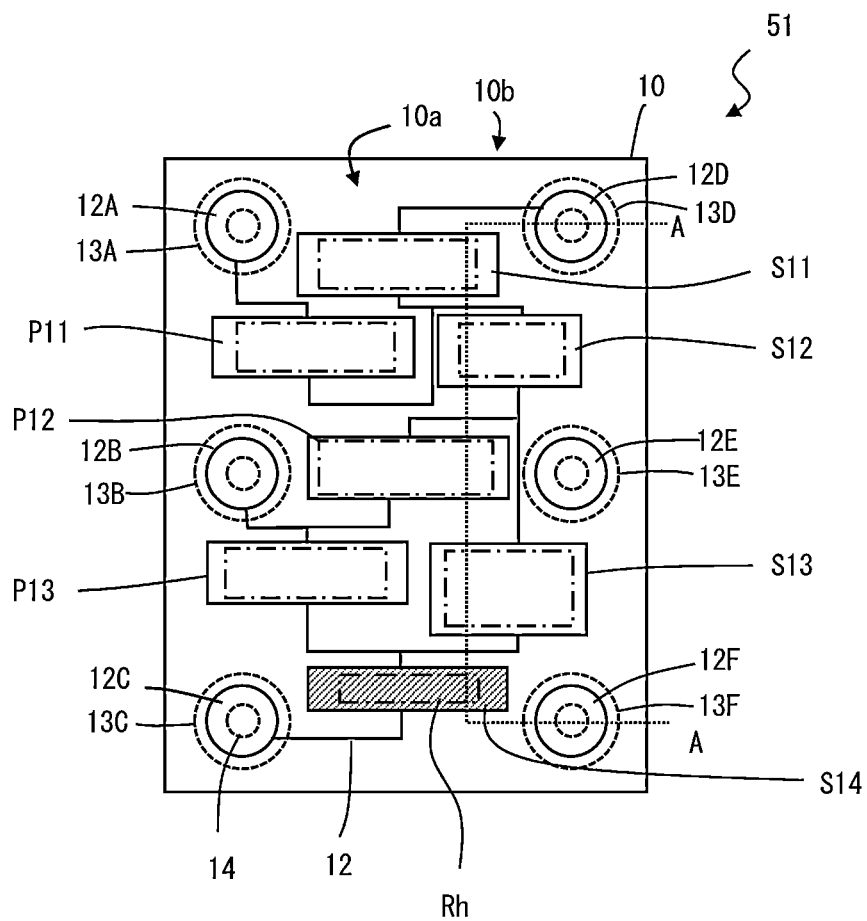
FIG. 2 is a schematic plan view where a plan structure of a first acoustic wave filter of the acoustic wave device according to the first preferred embodiment of the present invention is seen from an upper side.
Figure 3:
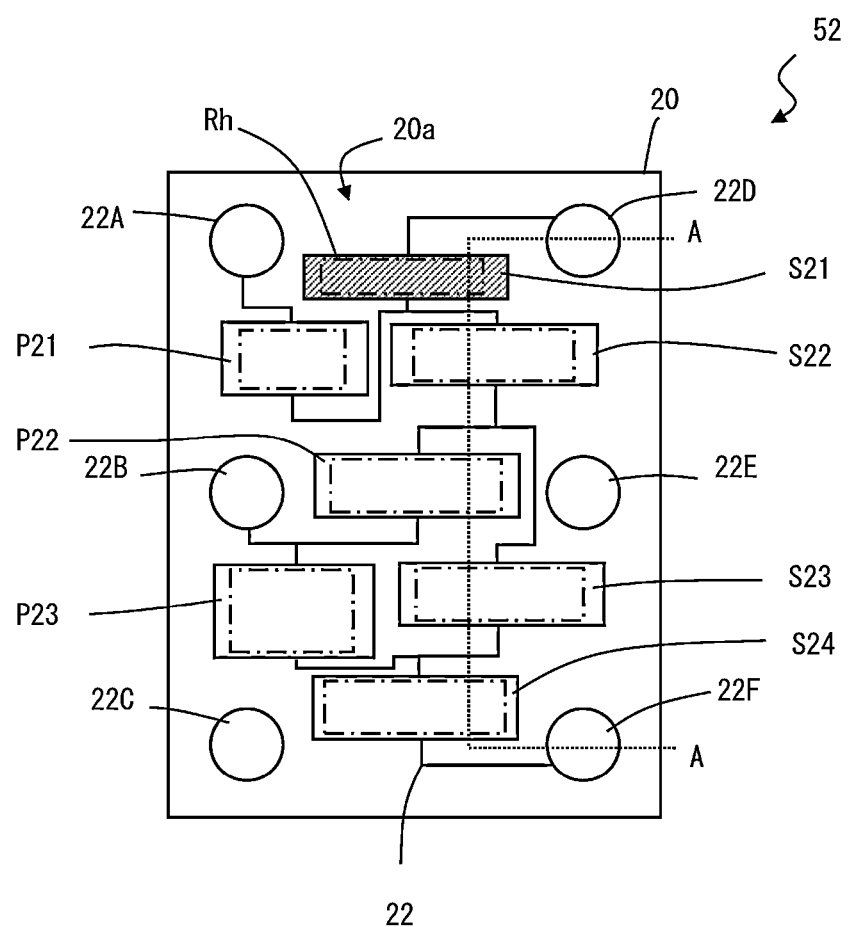
FIG. 3 is a schematic plan view where a plan structure of a second acoustic wave filter of the acoustic wave device according to the first preferred embodiment of the present invention is seen from the upper side.
Figure 4:
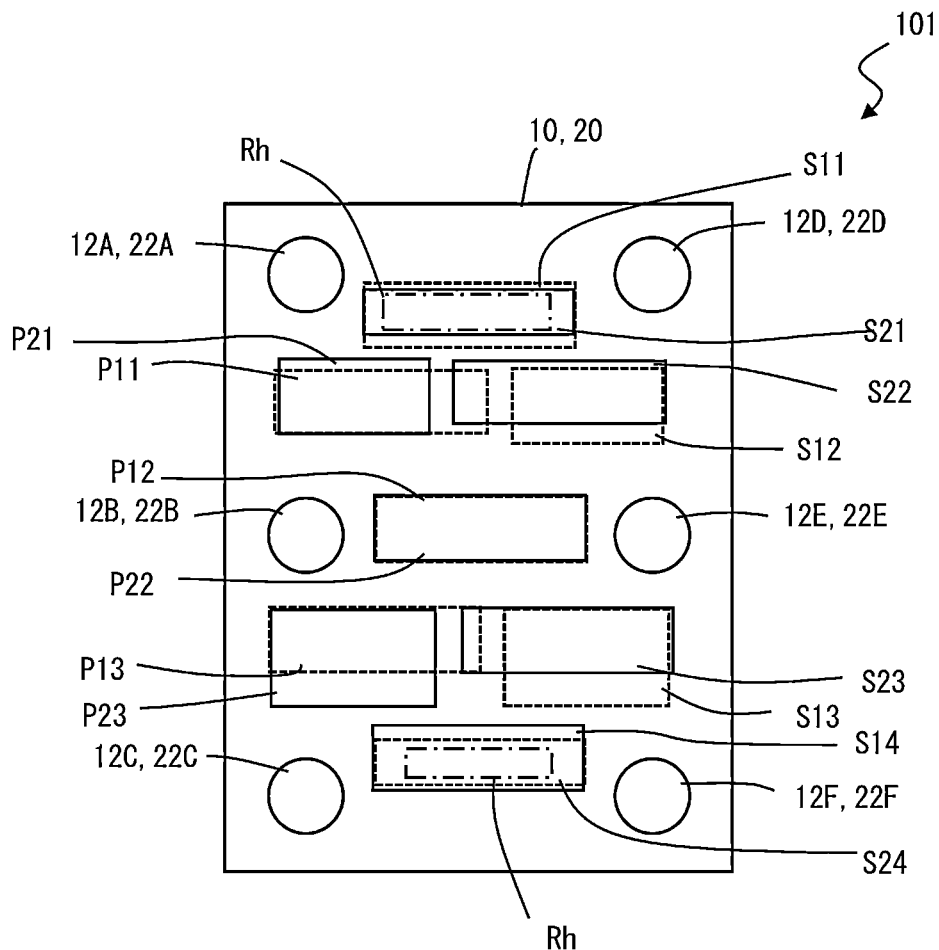
FIG. 4 is a schematic plan view where a plan structure of the acoustic wave device according to the first preferred embodiment of the present invention is seen from the upper side.
Figure 5:
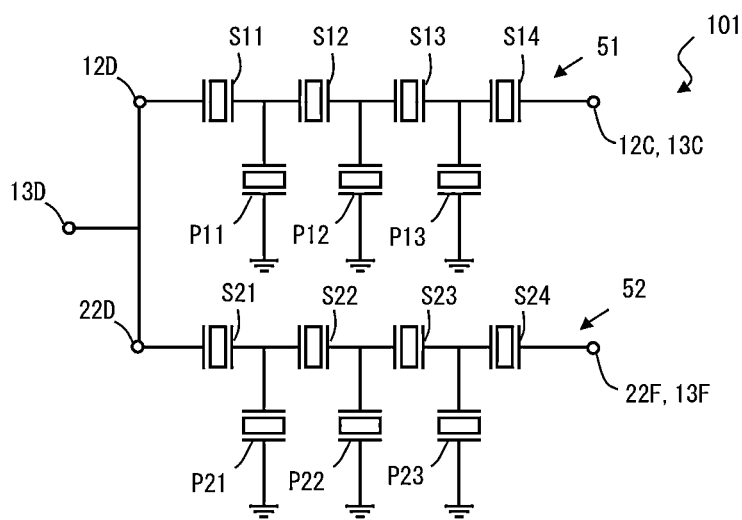
FIG. 5 is an equivalent circuit diagram of the acoustic wave device according to the first preferred embodiment of the present invention.

An acoustic wave device according to a first preferred embodiment of the present invention is described in detail. FIG. 1 is a schematic view illustrating an example of a sectional structure of an acoustic wave device 101 of the present preferred embodiment. The acoustic wave device 101 of the present preferred embodiment is an acoustic wave device used in, for example, a band from about 700 MHz to about 2500 MHz, for example, and particularly used for, for example, a filter which utilizes surface acoustic wave elasticity. The acoustic wave device 101 includes a first acoustic wave filter 51 and a second acoustic wave filter 52. FIG. 2 is a schematic plan view where a plan structure of the first acoustic wave filter is seen from the upper side in FIG. 1, and FIG. 3 is a schematic plan view where a plan structure of the second acoustic wave filter is seen from the upper side in FIG. 1. FIG. 4 is a schematic plan view where a plan structure of the acoustic wave device 101 is seen from the upper side in FIG. 1, and FIG. 5 is an equivalent circuit diagram of the acoustic wave device 101.

FIG. 1 illustrates a section taken along line A-A in FIGS. 2 and 3. Moreover, although the structure illustrated in FIG. 3 is positioned on the lower side instead of the upper side, the structure is illustrated by solid lines while being seen through from the upper side to make understanding easier. Moreover, in FIG. 4, components other than resonators and inner terminals are not illustrated.

The first acoustic wave filter 51 includes a first piezoelectric substrate 10 and a plurality of first resonators 11. The first piezoelectric substrate 10 includes a first principal surface 10a and a second principal surface 10b located on the opposite side of the first principal surface 10a, and has piezoelectricity. The first piezoelectric substrate 10 is made of, for example, a piezoelectric single crystal such as $LiTaO_3$ and $LiNbO_3$. The first piezoelectric substrate 10 may be made of piezoelectric ceramics. Moreover, the first piezoelectric substrate 10 may have a multilayer structure in which a piezoelectric thin film is disposed on a support substrate. In the present preferred embodiment, for example, the first piezoelectric substrate 10 is a rotated Y-cut $LiTaO_3$ substrate, and the angle of rotation is preferably within a range of about 116° or larger and about 136° or smaller.

The plurality of first resonators 11 are located at the first principal surface 10a of the first piezoelectric substrate 10. Each of the plurality of first resonators 11 includes an IDT electrode. In the present preferred embodiment, as illustrated in FIG. 5, the plurality of first resonators 11 define a ladder circuit. Specifically, the plurality of first resonators 11 include series arm resonators S11, S12, S13, and S14 connected in series to each other, and parallel arm resonators P11, P12, and P13 connected in parallel to the series arm resonators. As illustrated in FIG. 2, the respective first resonators 11 are electrically connected to each other by wiring 12 located at the first principal surface 10a. The wiring 12 schematically shows only a connection relationship and does not show an actual pattern of conductors. In the plan view in FIG. 2 or the like, each of the first resonators 11 is schematically illustrated in a rectangular or substantially rectangular shape. Also as for the second acoustic wave filter 52 which will be describe below with reference to the drawings, a second resonator and wiring are illustrated schematically.

The plurality of first resonators 11 define a pass band of the first acoustic wave filter 51. Specifically, each of the first resonators 11 is a parallel arm resonator whose anti-resonant frequency exists in the pass band or a series arm resonator whose resonant frequency exists in the pass band. The pass band of the first acoustic wave filter 51 is defined within a range where, with reference to a peak value (the smallest value) of insertion loss, the value of the insertion loss is, for example, about 3 dB or smaller from the peak value.

Figure 6:
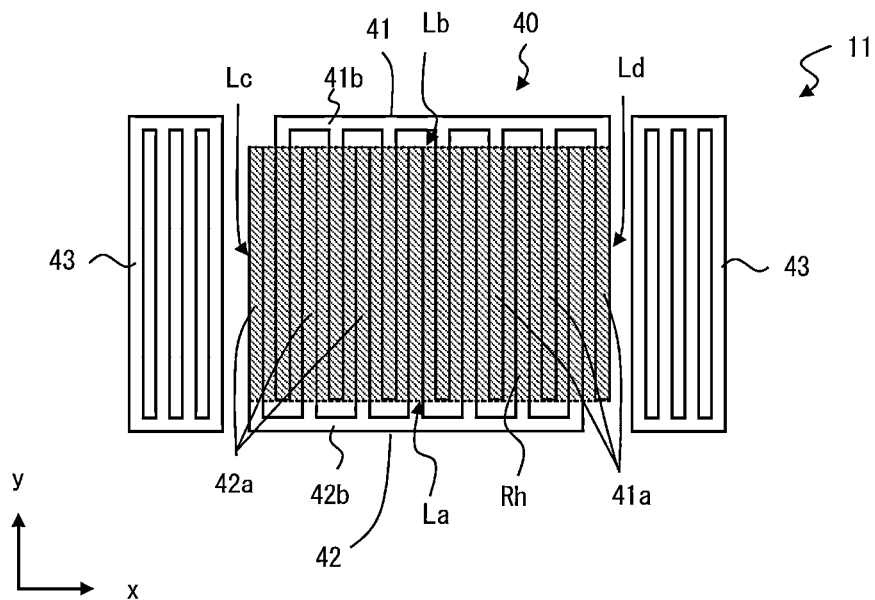
FIG. 6 is a schematic plan view illustrating a structure of a first resonator of the acoustic wave device according to the first preferred embodiment of the present invention.

Each of the first resonators 11 includes at least one IDT electrode. FIG. 6 is a plan view schematically illustrating a structure of one of the plurality of first resonators 11. The first resonator 11 illustrated in FIG. 6 includes an IDT electrode 40 located at the first piezoelectric substrate 10. The IDT electrode 40 includes a pair of comb-shaped electrodes 41 and 42. The comb-shaped electrode 41 includes a plurality of electrode fingers 41a extending in a y-axis direction, and a busbar 41b connected to one end of each of the plurality of electrode fingers 41a. The comb-shaped electrode 42 includes a plurality of electrode fingers 42a extending in the y-axis direction, and a busbar 42b connected to one end of each of the plurality of electrode fingers 42a.

The pair of comb-shaped electrodes 41 and 42 are disposed on the first piezoelectric substrate 10 such that the electrode fingers 41a and 42a overlap each other in an x-axis direction orthogonal or substantially orthogonal to a direction in which the electrode fingers extend. When a signal is supplied to the comb-shaped electrodes 41 and 42, an acoustic wave is excited at the first piezoelectric substrate 10 and is propagated in the x-axis direction. In the excitation of an acoustic wave, electromagnetic energy is converted into mechanical energy. At this time, heat is generated due to factors such as dielectric loss and vibration loss.

This range where an acoustic wave is excited and heat is generated is referred to as a heat generation range Rh. The heat generation range Rh is a range where the electrode fingers 41a of the comb-shaped electrode 41 and the electrode fingers 42a of the comb-shaped electrode 42 overlap each other in the x-axis direction. An outer edge of the heat generation range Rh in the y-axis direction is defined by a straight line La connecting tip ends of the electrode fingers 41a and a straight line Lb connecting tip ends of the electrode finger 42a. Moreover, an outer edge of the heat generation range Rh in the x-axis direction is defined by outer edges Lc and Ld located, in the IDT electrode 40, at outer side portions of pairs of electrode fingers which are located at the outermost side portions in the x-axis direction. The heat generation range Rh has a rectangular or substantially rectangular shape in FIG. 6. Moreover, in the plan views such as FIGS. 2 to 4, the heat generation range Rh is indicated by a one-dot chain line.

Apodization may be applied to the IDT electrode 40. In this case, the width of the range where the electrode fingers 41a and the electrode fingers 42a overlap each other varies in the x-axis direction. Therefore, the outer edges La and Lb of the heat generation range Rh in the y-axis direction become bent lines or curved lines.

Each of the first resonators 11 may include one or more IDT electrodes arranged in a propagation direction of an acoustic wave. Moreover, each of the first resonators 11 may include reflectors 43 sandwiching the IDT electrode 40 therebetween. The IDT electrode 40 and the reflectors 43 are each made of a metal layer including a single layer or a plurality layers. The metal layer includes, for example, Al, Pt, Au, Cu, W, Mo, Ta, Ni, or Cr, or an alloy including at least one of Al, Pt, Au, Cu, W, Mo, Ta, Ni, or Cr.

As is apparent from the above description, the heat generation range Rh does not include the reflectors 43. Moreover, in the IDT electrode 40, the busbars 41b and 42b, a gap from the busbar 41b to the tip end of the electrode finger 41a, and a gap from the busbar 42b to the tip end of the electrode finger 42a are not included in the heat generation range Rh.

As illustrated in FIG. 2, the first acoustic wave filter 51 further includes inner terminals 12A, 12B, 12C, 12D, 12E, and 12F disposed on the first principal surface 10a, and outer terminals 13A, 13B, 13C, 13D, 13E, and 13F disposed on the second principal surface 10b. The inner terminal 12A and the outer terminal 13A are electrically connected to each other by a via conductor 14 provided inside the first piezoelectric substrate 10. Similarly, the inner terminals 12B to 12F and the outer terminals 13B to 13F are electrically connected to each other, respectively, by the via conductors 14. In the present preferred embodiment, the outer terminal 13D is a terminal connected to an antenna, and the outer terminal 13C is a terminal connected to a transmission circuit. Moreover, the outer terminal 13F is a terminal connected to a reception circuit.

In the present preferred embodiment, for example, the first acoustic wave filter 51 is a transmission filter, and one end of the series arm resonator S11 is electrically connected to the inner terminal 12D. Moreover, one end of the series arm resonator S14 is electrically connected to the inner terminal 12C. As will be described below in detail, among the plurality of first resonators 11 of the first acoustic wave filter 51, the heat generation range Rh of the series arm resonator S14 has the smallest area.

The second acoustic wave filter 52 includes a second piezoelectric substrate 20 and a plurality of second resonators 21. The second piezoelectric substrate 20 is also made of material the same as or similar to the first piezoelectric substrate 10. The material of the second piezoelectric substrate 20 and the material of the first piezoelectric substrate 10 may be the same as or different from each other.

The plurality of second resonators 21 are located at a first principal surface 20a of the second piezoelectric substrate 20. Each of the plurality of second resonators 21 also includes an IDT electrode. Similarly to the first acoustic wave filter 51, the plurality of second resonators 21 define a ladder circuit. Specifically, the plurality of second resonators 21 include series arm resonators S21, S22, S23, and S24 connected in series to each other, and parallel arm resonators P21, P22, and P23 connected in parallel to the series arm resonators. As illustrated in FIG. 3, the respective second resonators 21 are electrically connected to each other by wiring 22 located at the first principal surface 20a. The plurality of second resonators 21 also have a structure the same as or similar to the first resonators 11, and are made of the same or similar material. Moreover, each of the second resonators 21 includes the heat generation range Rh.

The second acoustic wave filter 52 includes inner terminals 22A, 22B, 22C, 22D, 22E, and 22F disposed on the first principal surface 20a.

In the present preferred embodiment, for example, the second acoustic wave filter 52 is a reception filter, and one end of the series arm resonator S21 is electrically connected to the inner terminal 22D. Moreover, one end of the series arm resonator S24 is electrically connected to the inner terminal 22F. Among the plurality of second resonators 21 of the second acoustic wave filter 52, the heat generation range Rh of the series arm resonator S21 has the smallest area.

As illustrated in FIG. 1, the first acoustic wave filter 51 and the second acoustic wave filter 52 are disposed such that the plurality of first resonators 11 and the plurality of second resonators 21 are opposed to each other with a gap d therebetween. That is, the first principal surface 10a of the first piezoelectric substrate 10 and the first principal surface 20a of the second piezoelectric substrate 20 are opposed to each other. The gap d is approximately 10 μm or larger and approximately 50 μm or smaller, for example.

A support 31 is provided between the first piezoelectric substrate 10 and the second piezoelectric substrate 20 disposed to be opposed to each other. The support member 31 extends along outer edges of the first piezoelectric substrate 10 and the second piezoelectric substrate 20 so as to surround the plurality of first resonators 11, the plurality of second resonators 21, the inner terminals 12A to 12F, and the inner terminals 22A to 22F, and seals a space where the plurality of first resonators 11 and the plurality of second resonators 21 are provided. The space surrounded by the first piezoelectric substrate 10, the second piezoelectric substrate 20, and the support 31 is filled with air or inert gas such as, for example, nitrogen.

Moreover, a conductor 32 is provided between the inner terminals 12A to 12F and the inner terminals 22A to 22F so that the inner terminals 12A to 12F are electrically connected to the inner terminals 22A to 22F, respectively.

As illustrated in FIGS. 1 and 4, in plan view, the series arm resonator S14 of the first acoustic wave filter 51 overlaps the series arm resonator S24 of the second acoustic wave filter. The series arm resonator S21 of the second acoustic wave filter 52 overlaps the series arm resonator S11 of the first acoustic wave filter 51. However, the heat generation range Rh of the series arm resonator S14 of the first acoustic wave filter 51 does not overlap the heat generation range Rh of the series arm resonator S21 of the second acoustic wave filter. In the present preferred embodiment, the series arm resonator S14 and the series arm resonator S21 do not overlap each other also in a range other than the heat generation ranges Rh. From a perspective of further separating the heat generation ranges Rh from each other, as described above, the entire series arm resonator S14 and the entire series arm resonator S21 may not to overlap each other in plan view.

The acoustic wave device 101 is, for example, a duplexer used in communication in a frequency division duplex (abbreviated as FDD) system. As described above, for example, the first acoustic wave filter 51 is the transmission filter, and the second acoustic wave filter 52 is the reception filter.

During communication, the first acoustic wave filter 51 and the second acoustic wave filter 52 are used simultaneously, and signals are simultaneously applied to the first acoustic wave filter 51 and the second acoustic wave filter 52. Here, "simultaneously" means that, for example, reception and transmission may simultaneously be executed based on the communication system, and is not limited to a case where the reception and transmission are simultaneously executed at all times. For example, when two parties communicate with each other using the FDD system, there is a time when both of them simultaneously speak and listen to the other parties' voices. Moreover, there may be a time when one of them speaks and the other of them listens to the one's voice without speaking. Furthermore, "simultaneously" refers to a state in which a plurality of bands are used in a communication system where a plurality of bands with different bandwidths are used for communication by carrier aggregation or the like.

When signals are applied to the first acoustic wave filter 51 and the second acoustic wave filter 52, heat is generated in the heat generation ranges Rh of the first resonator 11 and the second resonator 21. In the first acoustic wave filter 51, the signal is inputted from the outer terminal 13C to the inner terminal 12C, and then to the series arm resonators S14, S13, S12, and S11 in this order, and is radiated as an electromagnetic wave, via the inner terminal 12D, from the antenna connected to the outer terminal 13D. At this time, a current of the same or substantially the same magnitude flows in the series arm resonators S14, S13, S12, and S11. Therefore, in the series arm resonator S14 including the heat generation range Rh having the smallest area, an amount of heat generation per unit area in the heat generation range Rh becomes the largest. As a result, the temperature of the heat generation range Rh of the series arm resonator S14 (a first heat-generation resonator in the present preferred embodiment) indicated by hatching in FIG. 2 becomes the highest.

Similarly, in the second acoustic wave filter 52, the signal is inputted from the outer terminal 13D connected to the antenna to the inner terminal 22D, and then to the series arm resonators S21, S22, S23, and S24 in this order, and is inputted, via the inner terminal 22F, into the reception circuit connected to the outer terminal 13F. At this time, a current of the same or substantially the same magnitude flows in the series arm resonators S21, S22, S23, and S24. Therefore, in the series arm resonator S21 including the heat generation range Rh having the smallest area, an amount of heat generation per unit area in the heat generation range Rh becomes the largest. As a result, the temperature of the heat generation range Rh of the series arm resonator S21 (a second heat-generation resonator in the present preferred embodiment) indicated by hatching in FIG. 3 becomes the highest.

However, the heat generation range Rh of the series arm resonator S14 and the heat generation range Rh of the series arm resonator S21 each having the highest temperature at the time of signal application do not overlap each other in plan view. That is, a portion of or the entire heat generation range Rh of the series arm resonator S14 and a portion of or the entire heat generation range Rh of the series arm resonator S21 are not close to each other in the gap d. Therefore, it is possible to reduce or prevent an increase in the temperature of the series arm resonator S14 and the series arm resonator S21, which occurs when heat sources are close to each other in a narrow range and heat stays in the narrow range.

Therefore, according to the acoustic wave device 101, even when signals are simultaneously applied to the first acoustic wave filter 51 and the second acoustic wave filter 52, accumulation of generated heat by the resonators can be reduced or prevented. Thus, a decrease in reliability due to electrochemical migration or degradation of metal of the IDT electrode of the resonator can be reduced or prevented. Moreover, since degradation of the IDT electrode due to heat can be reduced or prevented, a high-power signal can be applied to the acoustic wave device 101 while the decrease in reliability is reduced or prevented, and electric power handling capability can be improved.

In the first acoustic wave filter 51 and the second acoustic wave filter 52, resonators that include the heat generation ranges having the highest temperature at the time of signal application can be determined by, for example, obtaining thermography images of the first acoustic wave filter and the second acoustic wave filter 52 while the signals are applied thereto, and assuming the temperature of the resonators based on the obtained images. Alternatively, when amounts of heat generation can be calculated through simulation based on design data of the first acoustic wave filter 51 and the second acoustic wave filter 52, the value obtained through the simulation can be used.

Second Preferred Embodiment

Figure 7:
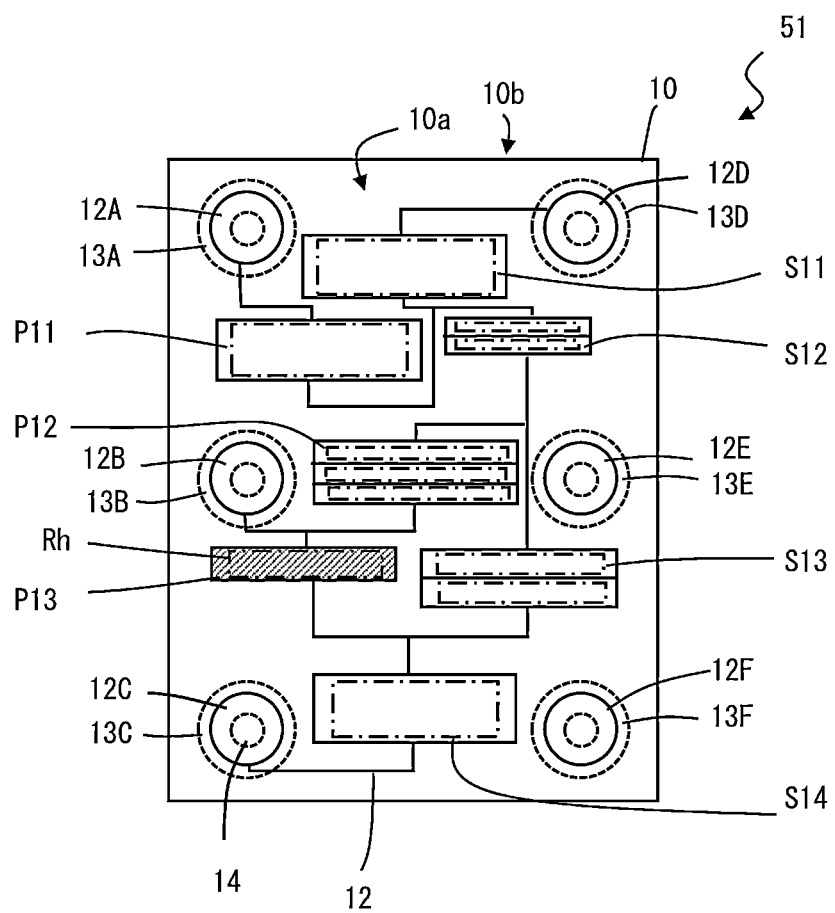
FIG. 7 is a schematic plan view where a plan structure of a first acoustic wave filter of an acoustic wave device according to a second preferred embodiment of the present invention is seen from an upper side.
Figure 8:
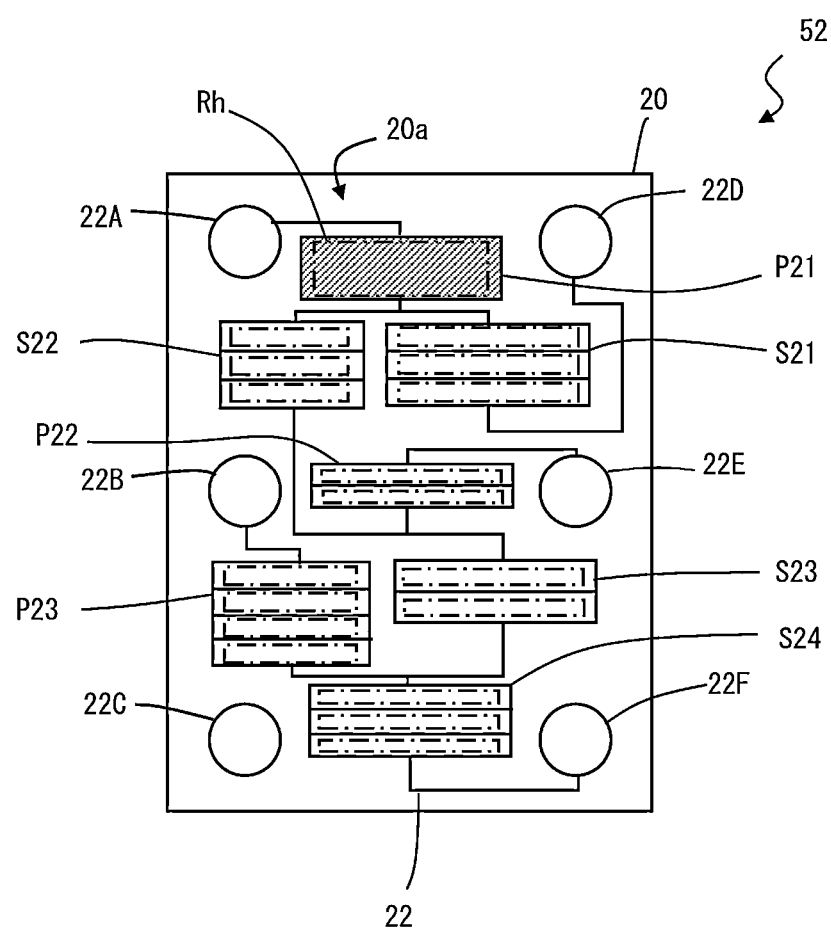
FIG. 8 is a schematic plan view where a plan structure of a second acoustic wave filter of the acoustic wave device according to the second preferred embodiment of the present invention is seen from the upper side.
Figure 9:
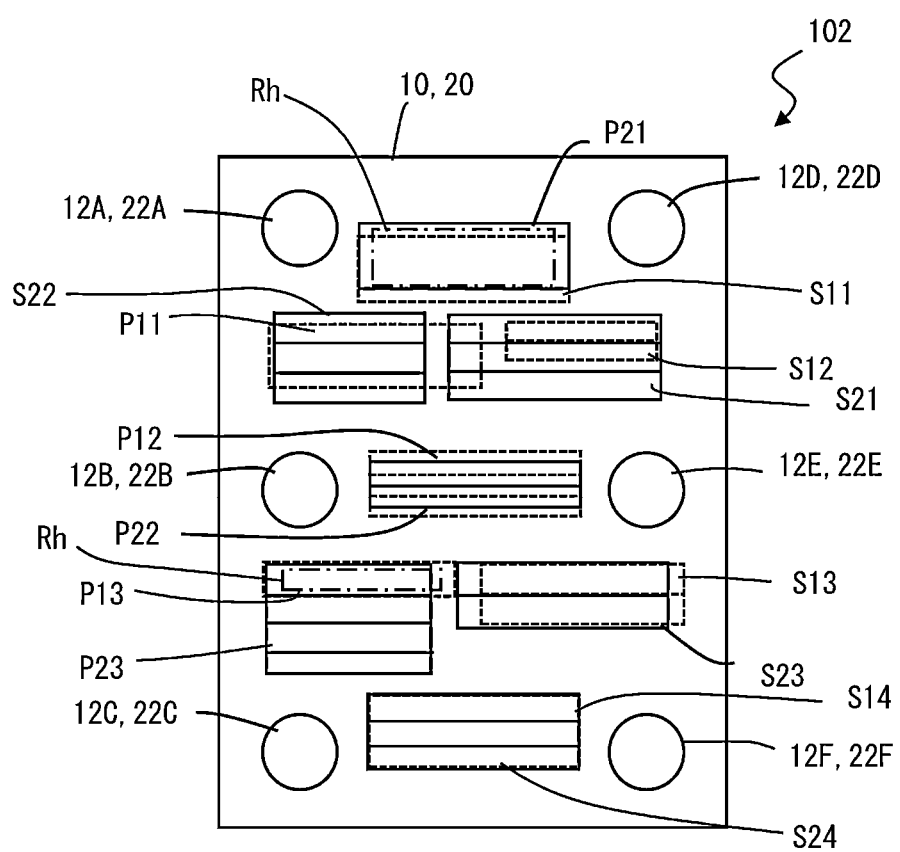
FIG. 9 is a schematic plan view where a plan structure of the acoustic wave device according to the second preferred embodiment of the present invention is seen from the upper side.
Figure 10:
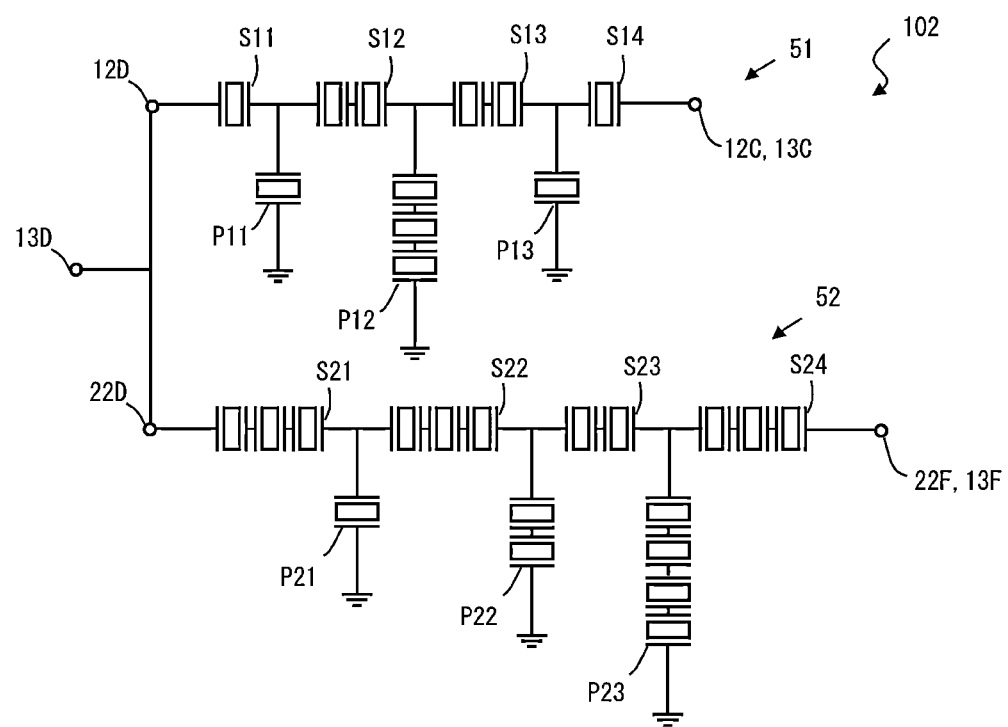
FIG. 10 is an equivalent circuit diagram of the acoustic wave device according to the second preferred embodiment of the present invention.

An acoustic wave device according to a second preferred embodiment of the present invention is described in detail. FIG. 7 is a schematic plan view where a plan structure of a first acoustic wave filter of an acoustic wave device 102 of the present preferred embodiment is seen from the upper side, and FIG. 8 is a schematic plan view where a plan structure of a second acoustic wave filter is seen from the upper side in FIG. 1. FIG. 9 is a schematic plan view where a plan structure of the acoustic wave device 102 is seen from the upper side in FIG. 1, and FIG. 10 is an equivalent circuit diagram of the acoustic wave device 102.

The acoustic wave device 102 of the present preferred embodiment is different from the first preferred embodiment in that each of the first acoustic wave filter 51 and the second acoustic wave filter 52 includes a resonator divided in series. The resonator divided in series is a resonator in which a plurality of resonators are connected in series without including therebetween a branch point to a signal path including another resonator.

Among the plurality of first resonators 11 of the first acoustic wave filter 51, each of the series arm resonators S12 and S13 includes, for example, two IDT electrodes connected in series. Moreover, the parallel arm resonator P12 includes, for example, three IDT electrodes connected in series. The series arm resonators S12 and S13 do not include a branch point to a signal path including another resonator. Also, the parallel arm resonator P12 does not include a branch point to a signal path including another resonator.

Moreover, in the second acoustic wave filter 52, each of the series arm resonators S21, S22, and S24 includes, for example, three IDT electrodes connected in series, and the series arm resonator S23 includes, for example, two IDT electrodes connected in series. The series arm resonators S21, S22, and S24 do not include a branch point to a signal path including another resonator. Moreover, the parallel arm resonator P22 includes, for example, two IDT electrodes connected in series, and the parallel arm resonator P23 includes, for example, four IDT electrodes connected in series. Also, the parallel arm resonators P22 and P23 do not include a branch point to a signal path including another resonator.

In such resonators, since each resonator is divided, concentration of heat can be reduced or prevented. Therefore, in the acoustic wave device 102, the resonator at the highest temperature at the time of signal application is the resonator which is not divided in series. In the first acoustic wave filter 51, among the series arm resonators S11 and S14 and the parallel arm resonators P11 and P13 which are not divided in series, the heat generation range Rh of the parallel arm resonator P13 has the smallest area. Therefore, among the plurality of resonators, the temperature of the heat generation range Rh of the parallel arm resonator P13 (the first heat-generation resonator in the present preferred embodiment) indicated by hatching in FIG. 7 becomes the highest. Moreover, in the second acoustic wave filter 52, the parallel arm resonator P21 (the second heat-generation resonator in the present preferred embodiment) indicated by hatching in FIG. 8 is not divided in series, and the heat generation range of the parallel arm resonator P21 has the smallest area.

Therefore, in the acoustic wave device 102, the heat generation range Rh of the parallel arm resonator P13 and the heat generation range Rh of the parallel arm resonator P21 are disposed so as not to overlap each other in plan view.

According to the acoustic wave device 102, among the resonators which are not divided in series in the first resonators 11, the parallel arm resonator P13 has the smallest heat generation range, and its temperature may be the highest among the first resonators 11 during use of the acoustic wave device 102. Moreover, among the resonators which are not divided in series in the second resonators, the parallel arm resonator P21 has the smallest heat generation range, and its temperature may be the highest among the second resonators 21 during the use of the acoustic wave device 102. Similarly to the first preferred embodiment, since the heat generation range Rh of the parallel arm resonator P13 and the heat generation range Rh of the parallel arm resonator P21 do not overlap each other in plan view, accumulation of heat generated by the respective resonators can be reduced or prevented. Thus, the acoustic wave device 102 has high reliability and electric power handling capability.

Third Preferred Embodiment

An acoustic wave device according to a third preferred embodiment of the present invention is described in detail.

Figure 11:
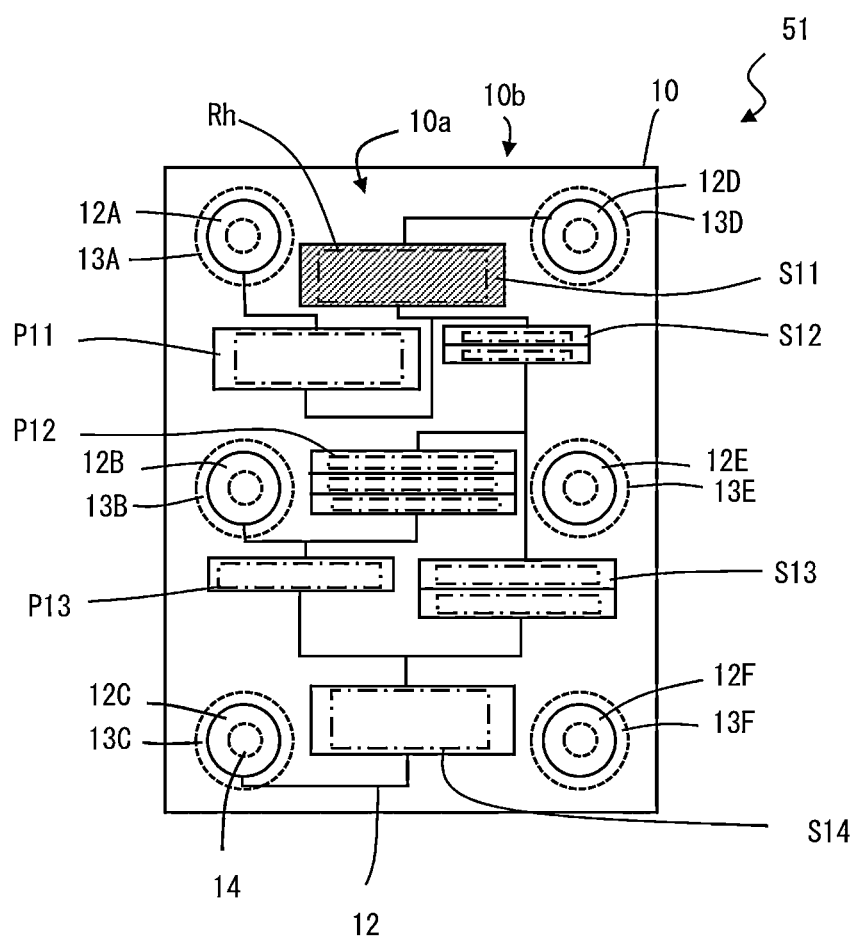
FIG. 11 is a schematic plan view where a plan structure of a first acoustic wave filter of an acoustic wave device according to a third preferred embodiment of the present invention is seen from an upper side.
Figure 12:
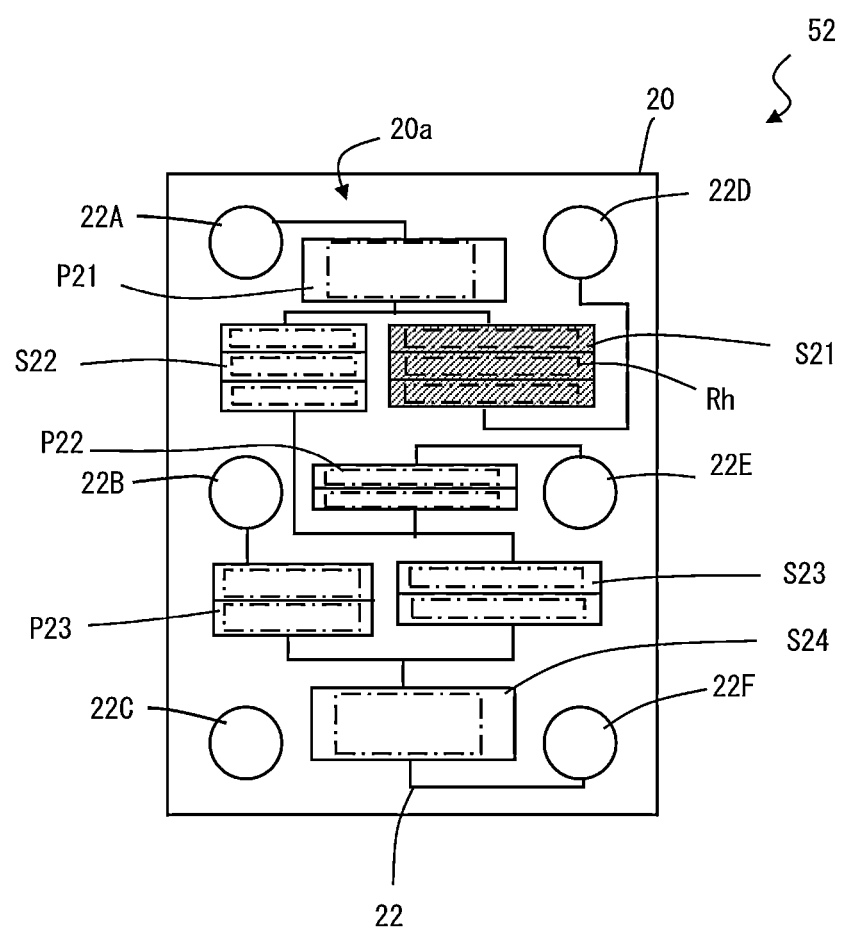
FIG. 12 is a schematic plan view where a plan structure of a second acoustic wave filter of the acoustic wave device according to the third preferred embodiment of the present invention is seen from the upper side.
Figure 13:
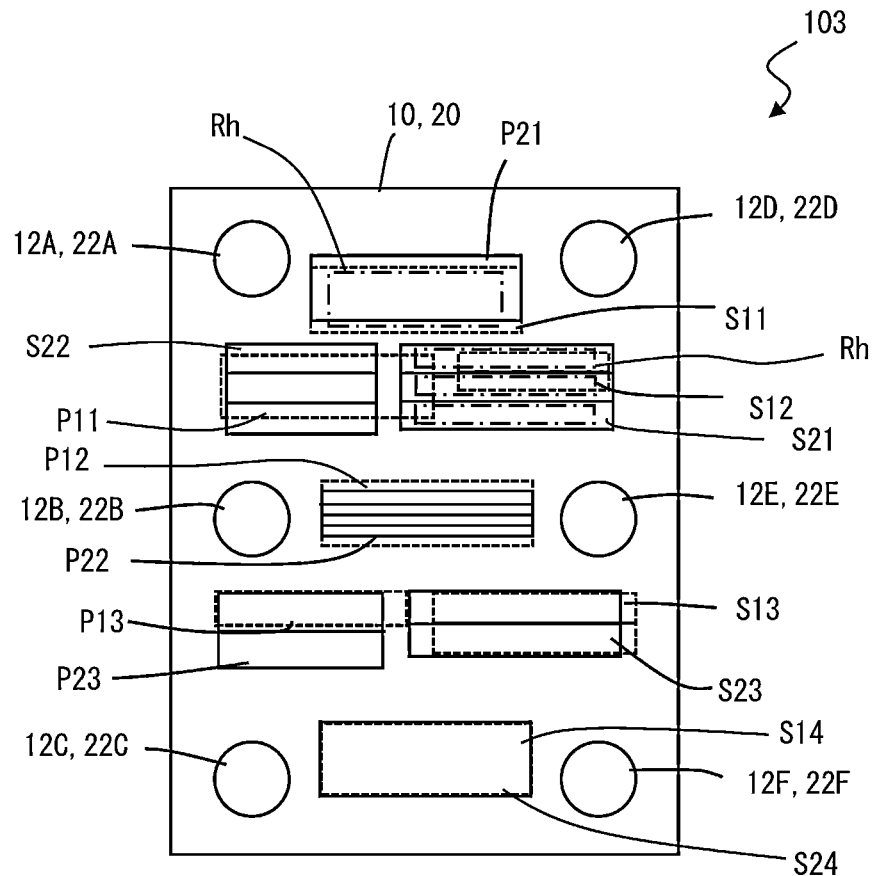
FIG. 13 is a schematic plan view where a plan structure of the acoustic wave device according to the third preferred embodiment of the present invention is seen from the upper side.
Figure 14:
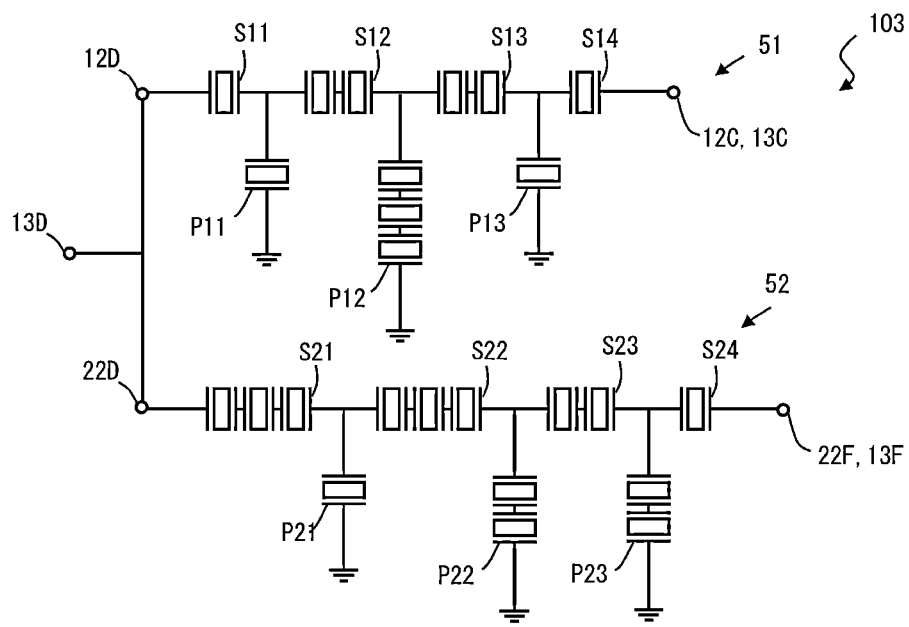
FIG. 14 is an equivalent circuit diagram of the acoustic wave device according to the third preferred embodiment of the present invention.

FIG. 11 is a schematic plan view where a plan structure of a first acoustic wave filter of an acoustic wave device 103 of the present preferred embodiment is seen from the upper side, and FIG. 12 is a schematic plan view where a plan structure of a second acoustic wave filter is seen from the upper side in FIG. 1. FIG. 13 is a schematic plan view where a plan structure of the acoustic wave device 103 is seen from the upper side in FIG. 1, and FIG. 14 is an equivalent circuit diagram of the acoustic wave device 103.

The acoustic wave device 103 is a reception filter used in a communication system using carrier aggregation, for example. Therefore, the first acoustic wave filter 51 and the second acoustic wave filter 52 are reception filters.

The acoustic wave device 103 of the present preferred embodiment is different from the first preferred embodiment in that the heat generation range Rh of the series arm resonator S11 connected to the inner terminal 12D (first input terminal) of the first acoustic wave filter 51 and the heat generation range Rh of the series arm resonator S21 connected to the inner terminal 22D (second input terminal) of the second acoustic wave filter 52 do not overlap each other in plan view.

As described in the first preferred embodiment, the inner terminal 12D and the inner terminal 22D are electrically connected to each other by the via conductor 14, and are further electrically connected to the outer terminal 13D. Therefore, a radio wave signal received by the antenna is inputted first, in the first acoustic wave filter 51, into the series arm resonator S11 via the outer terminal 13D and the inner terminal 12D. Since the signal is inputted into the series arm resonator S11 without another resonator in between, dielectric loss and mechanical loss in another resonator are not caused, and the signal is not attenuated. Therefore, in the first acoustic wave filter 51, the heat generation range Rh of the series arm resonator S11 (the first heat-generation resonator in the present preferred embodiment) may have the highest temperature.

Similarly, a radio wave signal received by the antenna is inputted first, in the second acoustic wave filter 52, into the series arm resonator S21 via the outer terminal 13D and the inner terminal 22D. Since the signal is inputted into the series arm resonator S21 without another resonator in between, dielectric loss and mechanical loss in another resonator are not caused, and the signal is not attenuated. Therefore, in the second acoustic wave filter 52, the heat generation range Rh of the series arm resonator S21 (the second heat-generation resonator in the present preferred embodiment) may have the highest temperature.

In the acoustic wave device 103 of the present preferred embodiment, the heat generation range Rh of the series arm resonator S11 of the first acoustic wave filter 51 and the heat generation range Rh of the series arm resonator S21 of the second acoustic wave filter 52 do not overlap each other in plan view. Therefore, accumulation of heat generated by the respective resonators can be reduced or prevented. Thus, the acoustic wave device 103 has high reliability and electric power handling capability.

The acoustic wave device 103 may be a transmission filter used in a communication system using carrier aggregation, for example. In this case, the transmission circuit is connected to each of the outer terminal 13C and the outer terminal 13F which are not electrically connected to each other, and a signal is inputted first, in the first acoustic wave filter 51, into the series arm resonator S14 from the inner terminal 12C (first input terminal), and a signal is inputted first, in the second acoustic wave filter 52, into the series arm resonator S24 from the inner terminal 22F (second input terminal). When the heat generation ranges of these resonators have the highest temperature at the time of signal application, it is sufficient that the series arm resonator S14 and the series arm resonator S24 are disposed such that the heat generation range Rh of the series arm resonator S14 and the heat generation range of the series arm resonator S24 do not overlap each other in plan view.

Moreover, the acoustic wave device 103 may be, for example, a duplexer or a diplexer as described in the first preferred embodiment. For example, the first acoustic wave filter 51 may be a transmission filter, and the second acoustic wave filter 52 may be a reception filter. In this case, the series arm resonator S14 is a resonator which receives, from the inner terminal 12C (first input terminal), input of a signal first in the first acoustic wave filter 51. Moreover, the series arm resonator S21 is a resonator which receives, from the inner terminal 22D (second input terminal), input of a signal first in the second acoustic wave filter 52. The inner terminal 12C and the inner terminal 22D are not electrically connected to each other. The series arm resonator S14 is connected to the outer terminal 13C with the inner terminal 12C interposed therebetween, and is further connected to the external transmission circuit. Meanwhile, the series arm resonator S21 is connected to the outer terminal 13D with the inner terminal 22D interposed therebetween, and is connected to the antenna.

For the reasons described above, in the first acoustic wave filter 51 and the second acoustic wave filter 52, the heat generation range Rh of the series arm resonator S14 (first heat-generation resonator) and the heat generation range Rh of the series arm resonator S21 (second heat-generation resonator) may have the highest temperature. Therefore, by the heat generation range Rh of the series arm resonator S14 and the heat generation range Rh of the series arm resonator S21 being disposed so as not to overlap each other in plan view, accumulation of heat generated by the respective resonators can be reduced or prevented. Thus, the acoustic wave device 103 has high reliability and electric power handling capability.

Fourth Preferred Embodiment

Figure 15:
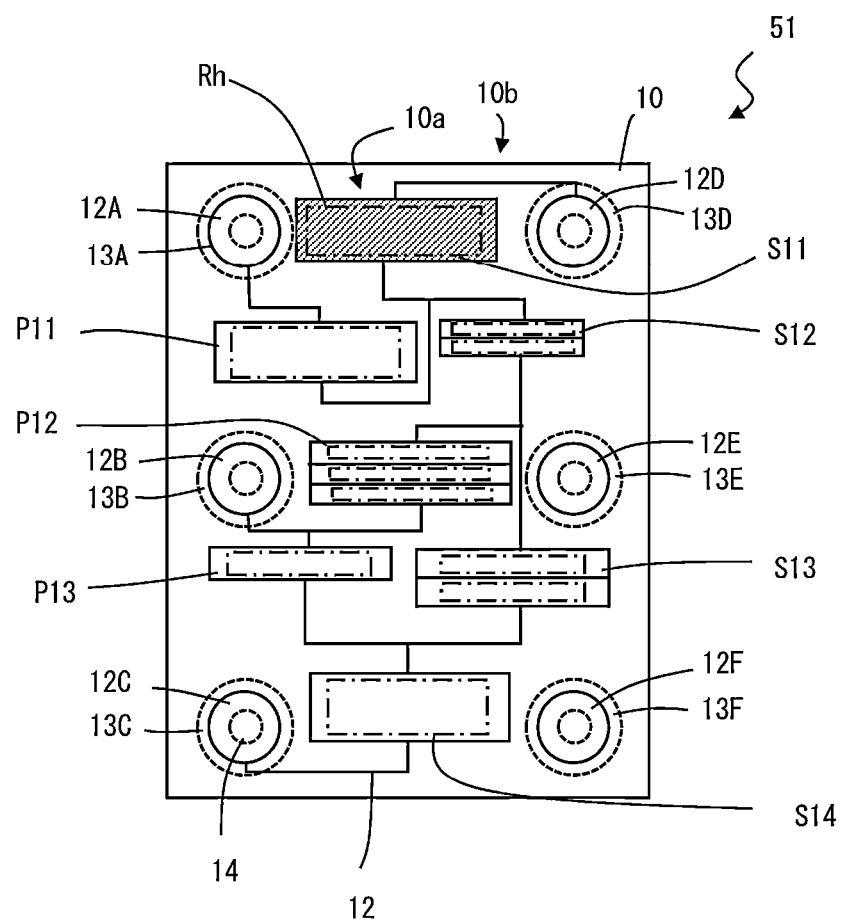
FIG. 15 is a schematic plan view where a plan structure of a first acoustic wave filter of an acoustic wave device according to a fourth preferred embodiment of the present invention is seen from an upper side.
Figure 16:
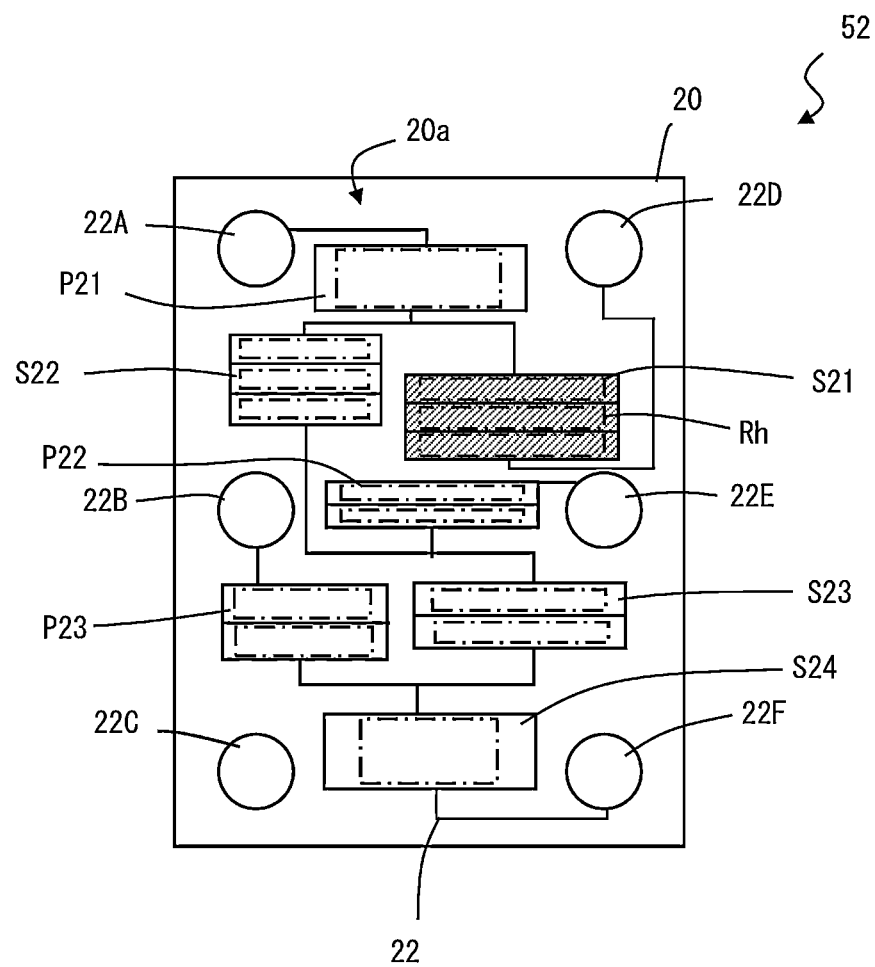
FIG. 16 is a schematic plan view where a plan structure of a second acoustic wave filter of the acoustic wave device according to the fourth preferred embodiment of the present invention is seen from the upper side.
Figure 17:
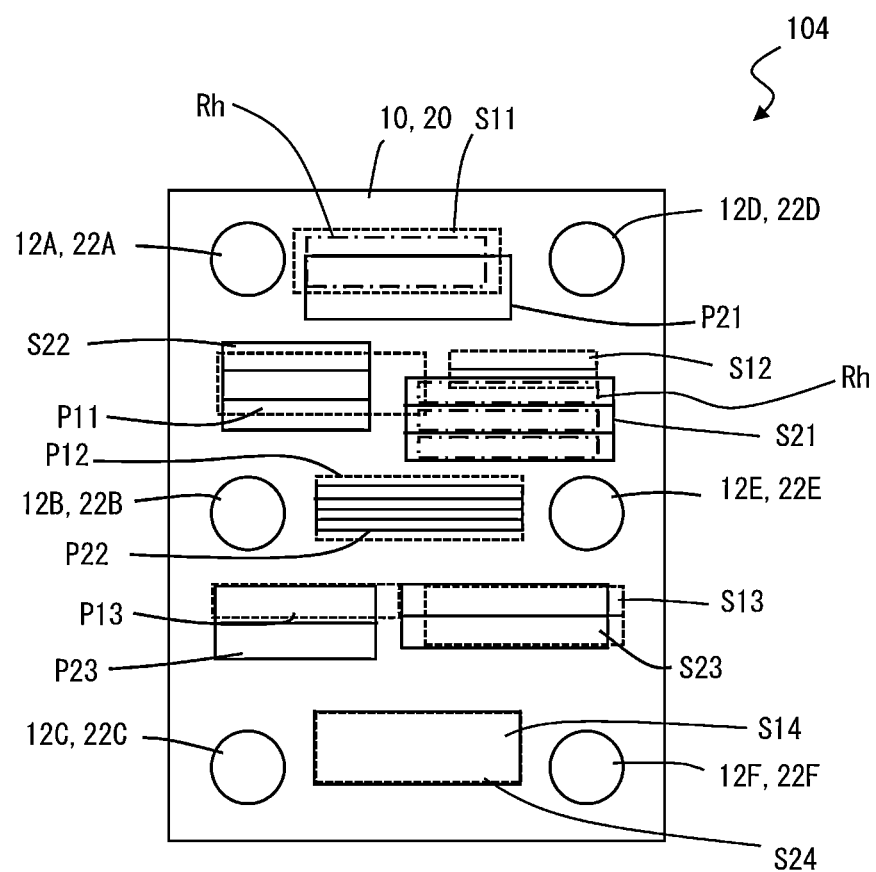
FIG. 17 is a schematic plan view where a plan structure of the acoustic wave device according to the fourth preferred embodiment of the present invention is seen from the upper side.

An acoustic wave device according to a fourth preferred embodiment of the present invention is described in detail. FIG. 15 is a schematic plan view where a plan structure of a first acoustic wave filter 51 of an acoustic wave device 104 of the present preferred embodiment is seen from the upper side, and FIG. 16 is a schematic plan view where a plan structure of a second acoustic wave filter 52 is seen from the upper side. FIG. 17 is a schematic plan view where a plan structure of the acoustic wave device 104 is seen from the upper side.

The acoustic wave device 104 of the present preferred embodiment is different from the third preferred embodiment in that the series arm resonator S11 where the heat generation range Rh has the highest temperature in the first acoustic wave filter 51 at the time of signal application and the series arm resonator S21 where the heat generation range Rh has the highest temperature in the second acoustic wave filter 52 at the time of signal application are close to outer terminals different from each other.

The series arm resonator S11 is closest to the outer terminal 13A among the outer terminals 13A to 13F in plan view, and the series arm resonator S21 is closest to the outer terminal 13D among the outer terminals 13A to 13F in plan view. Therefore, heat generated in the series arm resonator S11 is diffused, via the first piezoelectric substrate 10 and the via conductor 14, from the outer terminal 13A to, for example, an external substrate where the acoustic wave device 104 is mounted. Meanwhile, heat generated in the series arm resonator S21 is diffused, via the first piezoelectric substrate 10 and the via conductor 14, from the outer terminal 13D to, for example, the external substrate where the acoustic wave device 104 is mounted. In this manner, by heat generated in the series arm resonator S11 and the series arm resonator S21 being diffused to outer terminals different from each other, accumulation of heat can be further reduced or prevented.

Other Aspects

The acoustic wave devices of the present disclosure are not limited to the preferred embodiments described above, and various changes may be applied. For example, the first to fourth preferred embodiments described above may be suitably combined.

Moreover, in the acoustic wave devices according to preferred embodiments of the present invention, the resonator having the highest temperature in the first acoustic wave filter at the time of signal application and the resonator having the highest temperature in the second acoustic wave filter at the time of signal application do not overlap each other in plan view. Accordingly, reliability and electric power handling capability can be improved as described in the above preferred embodiments. As long as this condition is satisfied, the acoustic wave devices of the present disclosure are not limited to the above preferred embodiments.

Moreover, the number of resonators having the highest temperature in each of the first acoustic wave filter and the second acoustic wave filter at the time of signal application is not limited to one. For example, at the time of signal application, when a difference in temperature between the resonator at the highest temperature and the resonator at the second highest temperature in the first acoustic wave filter is small, the resonator at the second highest temperature may be included in the resonator at the highest temperature. That is, in this case, the number of resonators having the highest temperature is, for example, two. For example, assuming that the resonator at the highest temperature and the resonator at the second highest temperature are T1 and T2, respectively, when $(T1-T2)/T1 \leq$ approximately 0.05 (the temperature difference is approximately 5% or smaller) is satisfied, the resonator at the second highest temperature may be included as the resonator at the highest temperature. In this case, in plan view, the resonator at the highest temperature and the resonator at the second highest temperature in the first acoustic wave filter may be disposed so as not to overlap the resonator at the highest temperature in the second acoustic wave filter.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
    a first acoustic wave filter including a first piezoelectric substrate and a plurality of first resonators on the first piezoelectric substrate; and
    a second acoustic wave filter including a second piezoelectric substrate and a plurality of second resonators on the second piezoelectric substrate; wherein the first piezoelectric substrate and the second piezoelectric substrate are spaced apart from each other such that the plurality of first resonators and the plurality of second resonators are opposed to each other;

the plurality of first resonators include a first heat-generation resonator having a highest temperature in the first acoustic wave filter during use;

the plurality of second resonators include a second heat-generation resonator having a highest temperature in the second acoustic wave filter during use; and a heat generation range of the first heat-generation resonator and a heat generation range of the second heat-generation resonator do not overlap each other in plan view.

2. The acoustic wave device according to claim 1, wherein
the heat generation range of the first heat-generation resonator is a smallest range among heat generation ranges of the plurality of first resonators; and
the heat generation range of the second heat-generation resonator is a smallest range among heat generation ranges of the plurality of second resonators.

3. The acoustic wave device according to claim 2, wherein
the heat generation range of the first heat-generation resonator is a smallest range in the heat generation ranges of resonators included in the plurality of first resonators and not divided in series; and
the heat generation range of the second heat-generation resonator is a smallest range in the heat generation ranges of resonators included in the plurality of second resonators and not divided in series.

4. The acoustic wave device according to claim 1, wherein
the first acoustic wave filter includes a first input terminal to receive input of a signal to the first acoustic wave filter;
the first heat-generation resonator receives, from the first input terminal, input of the signal first among the plurality of first resonators;
the second acoustic wave filter includes a second input terminal to receive input of a signal to the second acoustic wave filter, and
the second heat-generation resonator receives, from the second input terminal, input of the signal first among the plurality of second resonators.

5. The acoustic wave device according to claim 4, wherein the first input terminal and the second input terminal are electrically connected to each other.

6. The acoustic wave device according to claim 4, wherein the first input terminal and the second input terminal are not electrically connected to each other.

7. The acoustic wave device according to claim 1, wherein
the plurality of first resonators define a ladder circuit, and the first heat-generation resonator is a series arm resonator of the ladder circuit; and
the plurality of second resonators define a ladder circuit, and the second heat-generation resonator is a series arm resonator of the ladder circuit.

8. The acoustic wave device according to claim 1, wherein
the plurality of first resonators define a ladder circuit, and the first heat-generation resonator is a parallel arm resonator of the ladder circuit; and
the plurality of second resonators define a ladder circuit, and the second heat-generation resonator is a parallel arm resonator of the ladder circuit.

9. The acoustic wave device according to claim 1, wherein the second piezoelectric substrate includes a second principal surface on an opposite side of the first principal surface, and a plurality of outer terminals provided at the second principal surface;
the plurality of outer terminals include a first outer terminal and a second outer terminal;
the first heat-generation resonator is closest to the first outer terminal among the plurality of outer terminals; and
the second heat-generation resonator is closest to the second outer terminal among the plurality of outer terminals.

10. The acoustic wave device according to claim 1, wherein the first acoustic wave filter is one of a reception filter or a transmission filter, and the second acoustic wave filter is another one of the reception filter and the transmission filter.

11. The acoustic wave device according to claim 1, wherein
the plurality of first resonators include first series arm resonators connected in series to each other, and first parallel arm resonators connected in parallel to the first series arm resonators; and
the plurality of second resonators include second series arm resonators connected in series to each other, and second parallel arm resonators connected in parallel to the second series arm resonators.

12. An acoustic wave device comprising:
a first acoustic wave filter including a first piezoelectric substrate and a plurality of first resonators on the first piezoelectric substrate; and
a second acoustic wave filter including a second piezoelectric substrate and a plurality of second resonators on the second piezoelectric substrate; wherein
the first piezoelectric substrate and the second piezoelectric substrate are spaced apart from each other such that the plurality of first resonators and the plurality of second resonators are opposed to each other;
each of the plurality of first resonators includes a heat generation range;
each of the plurality of second resonators includes a heat generation range; and
the heat generation range with a smallest area in the plurality of first resonators and the heat generation range with a smallest area in the plurality of second resonators do not overlap each other in plan view.

13. The acoustic wave device according to claim 12, wherein each of the heat generation range with the smallest area in the plurality of first resonators and the heat generation range with the smallest area in the plurality of second resonators is not a heat generation range of a resonator divided in series.

14. The acoustic wave device according to claim 12, wherein the first acoustic wave filter is one of a reception filter or a transmission filter, and the second acoustic wave filter is another one of the reception filter and the transmission filter.

15. The acoustic wave device according to claim 12, wherein
the plurality of first resonators include first series arm resonators connected in series to each other, and first parallel arm resonators connected in parallel to the first series arm resonators; and
the plurality of second resonators include second series arm resonators connected in series to each other, and second parallel arm resonators connected in parallel to the second series arm resonators.

16. An acoustic wave device comprising:
a first acoustic wave filter including a first piezoelectric substrate and a plurality of first resonators on the first piezoelectric substrate; and
a second acoustic wave filter including a second piezoelectric substrate and a plurality of second resonators on the second piezoelectric substrate; wherein
the first piezoelectric substrate and the second piezoelectric substrate are spaced apart from each other such that the plurality of first resonators and the plurality of second resonators are opposed to each other;
the first acoustic wave filter includes a first input terminal to receive input of a signal to the first acoustic wave filter;
the second acoustic wave filter includes a second input terminal to receive input of a signal to the second acoustic wave filter; and
a heat generation range of the first resonator to receive, from the first input terminal, input of the signal first among the plurality of first resonators and a heat generation range of the second resonator to receive, from the second input terminal, input of the signal first among the plurality of second resonators do not overlap each other in plan view.

17. The acoustic wave device according to claim 16, wherein the first acoustic wave filter is one of a reception filter or a transmission filter, and the second acoustic wave filter is another one the reception filter and the transmission filter.

18. The acoustic wave device according to claim 16, wherein
the plurality of first resonators include first series arm resonators connected in series to each other, and first parallel arm resonators connected in parallel to the first series arm resonators; and
the plurality of second resonators include second series arm resonators connected in series to each other, and second parallel arm resonators connected in parallel to the second series arm resonators.

* * * * *